United States Patent
Leibfritz et al.

(10) Patent No.: US 9,869,743 B2
(45) Date of Patent: Jan. 16, 2018

(54) CALIBRATION MODULE WITH INTEGRATED POWER DETECTOR

(71) Applicant: Rohde & Schwarz GmbH & Co. KG, Munich (DE)

(72) Inventors: Martin Leibfritz, Aying (DE); Steffen Neidhardt, Dorfen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 227 days.

(21) Appl. No.: 14/572,419

(22) Filed: Dec. 16, 2014

(65) Prior Publication Data

US 2015/0177357 A1 Jun. 25, 2015

(30) Foreign Application Priority Data

Dec. 23, 2013 (DE) .......................... 10 2013 227 138

(51) Int. Cl.
*G01R 35/00* (2006.01)
*G01R 27/04* (2006.01)

(52) U.S. Cl.
CPC ........... *G01R 35/005* (2013.01); *G01R 27/04* (2013.01)

(58) Field of Classification Search
CPC ..... G01R 35/005; G01R 35/007; G01R 21/10
See application file for complete search history.

(56) References Cited

U.S. PATENT DOCUMENTS

| | | | | |
|---|---|---|---|---|
| 6,570,397 B2* | 5/2003 | Mayder | ................ | G01R 31/319 324/750.02 |
| 6,614,237 B2* | 9/2003 | Ademian | ................ | G01R 27/28 324/601 |
| 7,759,944 B2* | 7/2010 | Hiebel | ................... | G01R 27/28 324/601 |
| 8,803,505 B2* | 8/2014 | Chizevsky | ........... | G01R 35/005 324/601 |
| 2004/0002322 A1* | 1/2004 | Krupezevic | .............. | H04B 1/30 455/323 |
| 2006/0010358 A1* | 1/2006 | Miller | ................ | G01R 31/3016 714/700 |
| 2008/0252298 A1* | 10/2008 | Noujeim | ................ | G01K 17/00 324/451 |
| 2010/0204943 A1* | 8/2010 | Heuermann | ......... | G01R 35/005 702/85 |
| 2011/0234215 A1* | 9/2011 | Ausserlechner | ....... | G01R 15/20 324/244 |
| 2011/0241712 A1* | 10/2011 | Zelder | .................... | G01R 27/28 324/750.16 |
| 2011/0254536 A1* | 10/2011 | Zelder | .................... | G01R 27/32 324/74 |

FOREIGN PATENT DOCUMENTS

| | | |
|---|---|---|
| DE | 202008013687 U1 | 1/2009 |
| DE | 102005018073 A1 | 3/2009 |
| DE | 102009030471 A1 | 1/2010 |
| WO | 2011110255 A2 | 1/2012 |

* cited by examiner

*Primary Examiner* — Jeff Natalini
(74) *Attorney, Agent, or Firm* — Ditthavong & Steiner, P.C.

(57) ABSTRACT

A calibration module with a substrate provides at least one high-frequency terminal integrated on the substrate which can be connected in each case with an allocated switching element integrated on the substrate to one of several allocated calibration standards or to an allocated power detector. The calibration standards and the power detector are integrated on the substrate.

14 Claims, 3 Drawing Sheets

CALIBRATION MODULE WITH INTEGRATED POWER DETECTOR

CROSS-REFERENCE TO RELATED APPLICATION

The present application claims priority to German Patent Application No. 10 2013 227 138.7 filed Dec. 23, 2013, the entire contents of which are herein incorporated by reference.

FIELD OF THE INVENTION

The invention, according to the various embodiments described herein, relates to a calibration module with integrated power detector. In particular, the calibration module serves for the calibration of a network analyzer.

DISCUSSION OF THE BACKGROUND

With the use of a vectorial network analyzer, system errors in the measurement arrangement falsify the characterization of high-frequency-technology components, modules and systems. In the context of a system-error calibration before the implementation of the measurement, the system errors at the individual test ports of the vectorial network analyzer are determined through sequential connection of the respective test port to several calibration standards, excitation of the respective calibration standard with an excitation signal and measurement of the signal reflected from the calibration standard. The signals measured in the characterization are corrected with the determined system errors.

In addition to the system-error calibration, a power calibration of every individual test port of the vectorial network analyzer using a power detector is required for a correct display of the measured signals as non-scaled signals.

SUMMARY OF THE INVENTION

According to one embodiment, the calibration module is realized on a substrate and contains at least one high-frequency terminal which can be connected respectively to at least one calibration standard or to a power detector via a switching unit. The at least one high-frequency terminal, the associated switching unit, the associated calibration standards and the associated power detector may be arranged on the same substrate.

In order to use the power detector alternately as a broadband, matched calibration standard and therefore to save one calibration standard or to use a calibration standard for the verification of the calibration, the power detector preferably provides a matched input impedance, in accordance with another embodiment.

In yet another embodiment, the power detector is accordingly constructed on a sub-region of the substrate of the calibration module. Accordingly, the elements required for a power detector may be applied by means of thin-layer technology as layers on the upper side of the sub-region of the substrate. On the lower side of the subregion of the substrate, in which the power detector is realized, a recess may be provided, which comprises a significantly lower thermal conductivity than the substrate and accordingly prevents a disadvantageous removal of heat from the power detector.

In another embodiment, a membrane which is brought into contact with the substrate of the calibration module with an appropriate terminal technology—for example, by means of gluing—may be used for the power detector. On the upper side of the membrane, which is typically thin-walled, the elements required for a power detector may be applied as layers, preferably by means of thin-layer technology. The lower side of the membrane on which the power detector is realized may be connected to at least one support element in order to realize a hollow cavity which is preferably filled with air beneath the membrane. Since the thermal conductivity of air is significantly lower than the thermal conductivity of the material of the membrane, a removal of heat from the power detector is accordingly prevented.

A decoupling capacitor may be provided between the switching unit and the power detector as a part of a direct-voltage and high-frequency decoupling network—a so-called bias-tee—in order to supply to the power detector only the high-frequency signal present in the switching unit, according to one embodiment. Accordingly, a routing to the power detector of the direct voltage present in a coil of the direct-voltage and high-frequency decoupling network which connects the power detector to the high-frequency terminal of the calibration module via the switching unit may be prevented. In order to realize a connection between the power detector realized on a membrane and a high-frequency line connected to the decoupling capacitor on the same level, a recess which receives the power detector realized on the membrane together with the support element may be provided in the substrate of the calibration module. In this context, the depth of the recess corresponds to the height of the power detector with the addition of the height of the support element.

The recess can be additionally extended from the region which receives the membrane with the power detector, preferably up to the nearest terminal of the decoupling capacitor. In the region of the extension, the recess may be filled, for example, with an adhesive compound and carries the high-frequency line on the upper side.

The power detector may be connected via a further high-frequency line to an analog-digital converter, also applied to the substrate of the calibration module, which implements an analog-digital conversion of the power level of the high-frequency signal supplied to the power detector delivered by the power detector.

The high-frequency line from the decoupling capacitor to the power detector may be embodied in a conical shape in the direction towards the power detector in order to achieve an impedance matching.

The analog-converted power level of the high-frequency signal supplied to the calibration module can be guided via a further high-frequency line to terminals of a data port, preferably a Universal-Serial-Bus (USB) data port, which may be also applied to the substrate.

The present invention, according to various embodiments, is directed to apparatus of operation that are further described in the following Brief Description of the Drawings, the Detailed Description of the Invention, and the claims. Other features and advantages of the embodiments will become apparent from the following detailed description of the invention made with reference to the accompanying drawings.

BRIEF DESCRIPTION OF THE DRAWINGS

Various embodiments of the calibration module are explained in detail in the following by way of example with reference to the drawings. The figures in the drawings show.

DETAILED DESCRIPTION OF THE DRAWINGS

In the following, the calibration module 1 is explained in detail with reference to FIG. 1. The entire calibration module 1 is realized on a substrate 2—preferably made of ceramic material. The calibration module preferably provides four high-frequency terminals $3_1$, $3_2$, $3_3$ and $3_4$, which are each connected to a test port of a vectorial network analyzer not illustrated in FIG. 1, in each case via a high-frequency line. Accordingly, each test port of the vectorial network analyzer can be connected sequentially to one of several calibration standards or to the power detector which are disposed on the calibration module 1. Alternatively, two test ports of the vectorial network analyzer are connected in each case by means of a through-connection via the calibration module 1.

Figure 1:
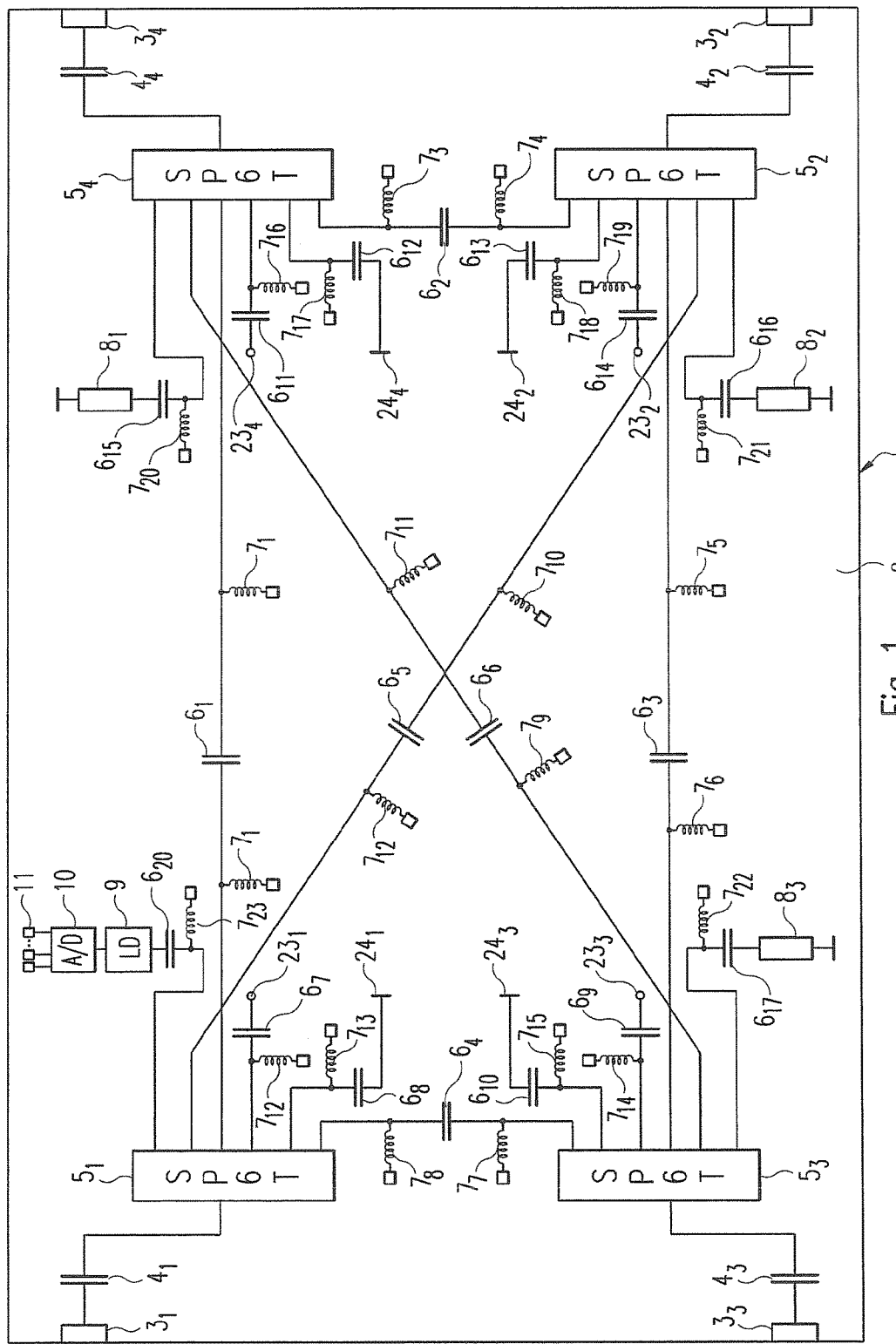
FIG. 1 a circuit diagram of an embodiment of the calibration module.

The fact that the calibration module 1 in FIG. 1 provides four high-frequency terminals $3_1$, $3_2$, $3_3$ and $3_4$ is only exemplary. Another number of high-frequency terminals in the calibration module 1 is also covered by the invention.

Each of these high-frequency terminals $3_1$, $3_2$, $3_3$ and $3_4$ is connected respectively via a decoupling capacitor $4_1$, $4_2$, $4_3$ and $4_4$ to an allocated switching unit $5_1$, $5_2$, $5_3$ and $5_4$. This switching unit $5_1$, $5_2$, $5_3$ and $5_4$ in the exemplary embodiment provides one input in each case and respectively six outputs—a so-called Single-Pole-6-Through (SP6T) switch.

In each case, three outputs of every SP6T switching unit $5_1$, $5_2$, $5_3$ and $5_4$ are connected respectively to an output of one of the other three SP6T switching units via a decoupling capacitor $6_1$, $6_2$, $6_3$, $6_4$, $6_5$ and $6_6$.

A through-connection in each case between the two high-frequency terminals $3_1$, $3_2$, $3_3$ and $3_4$ can be realized via the decoupling capacitors $6_1$, $6_2$, $6_3$, $6_4$, $6_5$ and $6_6$. Controlling the through-connection via the respective decoupling capacitor $6_1$, $6_2$, $6_3$, $6_4$, $6_5$ and $6_6$ is implemented via a control voltage embodied as a direct voltage at a terminal of a coil $7_1$, $7_2$, $7_3$, $7_4$, $7_5$, $7_6$, $7_7$, $7_8$, $7_9$, $7_{10}$ and $7_{11}$, which are arranged in each case at the input and output end of the decoupling capacitor $6_1$, $6_2$, $6_3$, $6_4$, $6_5$ and $6_6$. The decoupling capacitors $6_1$, $6_2$, $6_3$, $6_4$, $6_5$ and $6_6$ and the coils $7_1$, $7_2$, $7_3$, $7_4$, $7_5$, $7_6$, $7_7$, $7_8$, $7_9$, $7_{10}$ and $7_{11}$ arranged respectively at the input end and output end each form a direct-voltage high-frequency decoupling network (so-called bias-tee).

A fourth output of every SP6T-switching unit $5_1$, $5_2$, $5_3$ and $5_4$ is connected in each case to a calibration standard $23_1$, $23_2$, $23_3$ and $23_4$ realized in each case as an open terminal (Open), while a fifth output of every SP6T switching unit $5_1$, $5_2$, $5_3$ and $5_4$ is connected in each case to a calibration standard $24_1$, $24_2$, $24_3$ and $24_4$ realized as a short (Short). The calibration standard realized as open terminals or respectively the calibration standard realized as a short is connected to the respective SP6T switching unit $5_1$, $5_2$, $5_3$ and $5_4$ via a control voltage applied in the direct-voltage path of an allocated direct-voltage high-frequency decoupling network and embodied as a direct voltage. The respective direct-voltage high-frequency decoupling networks each comprise a decoupling capacitor $6_7$, $6_8$, $6_9$, $6_{10}$, $6_{11}$, $6_{12}$, $6_{13}$ and $6_{14}$ and in each case a coil $6_{12}$, $6_{13}$, $6_{14}$, $7_{15}$, $7_{16}$, $7_{17}$, $7_{18}$ and $7_{19}$.

While a calibration standard $8_1$, $8_2$ and $8_3$ realized as a broadband matched impedance (Match) is connected to the sixth output of the second, third and fourth SP6T switching unit $5_2$, $5_3$ and $5_4$, in each case via a further direct-voltage high-frequency decoupling network comprising respectively a decoupling capacitor $6_{16}$, $6_{17}$ and $6_{18}$ and a coil $7_{20}$, $7_{21}$ and $7_{22}$, at the sixth output of the first SP6T switching unit 51, a power detector 9 is connected via a direct-voltage high-frequency decoupling network comprising in each case a decoupling capacitor $6_{20}$ and respectively a coil $7_{23}$.

The power level of the high-frequency signal supplied to the power detector 9 determined by the power detector 9 is converted into a corresponding digital word in a downstream analog-digital converter 10 connected to the power detector 9 via a high-frequency line. The data word generated by the analog-digital converter 10 is guided via corresponding, individual high-frequency lines to terminals 11 of a data port—preferably a Universal Serial Bus (USB) data port, where they are transmitted via a corresponding data cable—for example, a USB cable—to the vectorial network analyzer or to another measuring device for the measurement evaluation.

In FIG. 1, the power detector 9 is connected only by way of example via the associated SP6T switching unit $5_1$ to the first high-frequency terminal $3_1$. Of course, the power detector 9 can also be connected to any of the other three high-frequency terminals $3_2$, $3_3$ and $3_4$. However, for reasons of cost, only one high-frequency terminal is preferably connected to a power detector 9.

For the power calibration of a test port of the vectorial network analyzer which is currently not connected to the power detector 9, there are two variants for power calibration:

In a first variant for the power calibration, the test port to be calibrated in each case with regard to its power level is connected by means of re-plugging the high-frequency measurement line to the high-frequency terminal of the calibration module 1, which is connected internally via an associated SP6T switching unit to the power detector 9.

In a second variant for the power calibration, the test port of the vectorial network analyzer to be calibrated with regard to its power level is connected via a high-frequency terminal of the calibration module 1 to the high-frequency terminal of the calibration module 1, which is connected via its allocated SP6T switching unit to the power detector 9. The power calibration is implemented on the basis of the power level of the excitation signal measured by the power detector and the excitation signal measured and received at the test port to be calibrated with regard to its power level.

The power detector 9 can be used not only for the power calibration but also for system-error calibration. If the power detector 9 provides a matched input impedance of preferably 50Ω for this purpose, it can be used as a matched and broadband calibration standard. A further broadband calibration standard can thus be made available for the verification of the calibration.

Figure 2A:
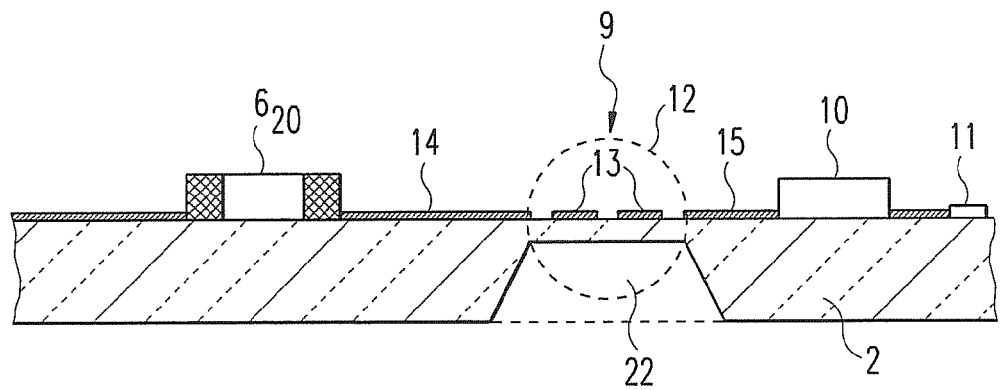
FIG. 2A a lateral view of a first embodiment of an arrangement of a power detector in the calibration module.
Figure 2B:
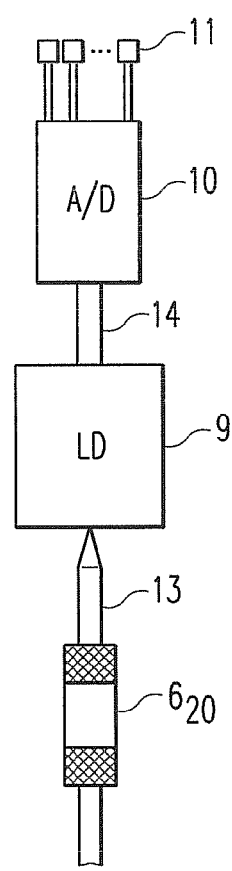
FIG. 2B a plan view of the first embodiment of an arrangement of the power detector in the calibration module.

In a first embodiment of the arrangement of the power detector 9 in the calibration module 1 as shown in FIGS. 2A and 2B, the power detector 9 is arranged in a sub-region 12 of the substrate 2. For this purpose, the layers 13 required for the power detector are applied to the substrate by means of masking, irradiation and etching-process steps, which will not be described in greater detail here.

A contacting between the high-frequency line 14, which realizes a connection between the decoupling capacitor $6_{20}$ and the power detector 9, and the layers 13 of the power detector 9 and between the line 15 which realizes a connection between the layers 13 of the power detector 9 and the analog-digital converter 10, is manufactured via appropriate high-frequency technology contacting techniques.

A recess 22 is provided in the sub-region 12 of the substrate 2. The air disposed in the recess 22 provides a significantly lower thermal conductivity than the substrate 2 realized as a thin layer and accordingly prevents an escape of the heat disposed in the power detector 9.

Figure 3A:
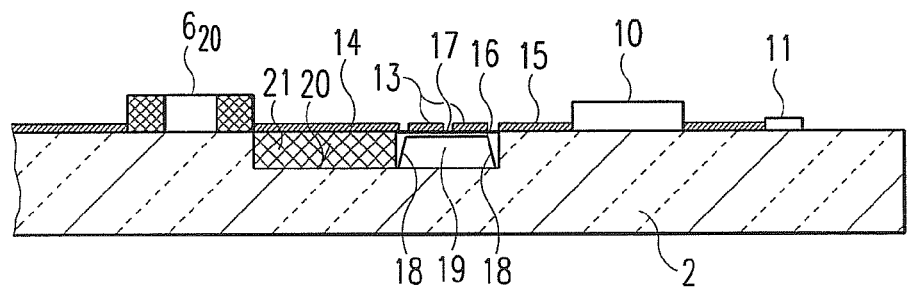
FIG. 3A a lateral view of a second embodiment of an arrangement of a power detector in the calibration module.
Figure 3B:
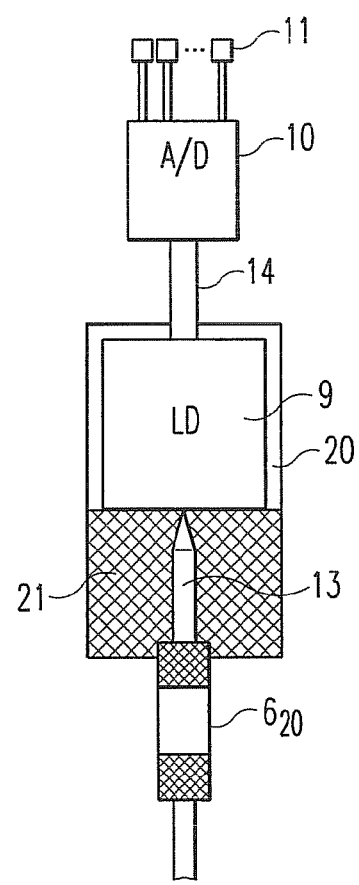
FIG. 3B a plan view of the second embodiment of the arrangement of the power detector in the calibration module.

In a second embodiment of the arrangement of the power detector 9 on the calibration module 1 as shown in FIGS. 3A and 3B, the power detector is applied to a thin membrane 15, preferably made from a semiconductor material such as silicon or silicon oxide.

The membrane 16 comprises a thin layer 17 which is supported at its lower side on at least one support element 18. The support element 18 can be, for example, a support foot attached beneath each corner of the thin layer 17, or a support frame attached beneath the four edges of the thin layer 17 or a support web attached in each case beneath two edges of the thin layer 17 or any other formation supporting the thin layer 17 of the membrane. Through the support of the thin layer 17 by means of at least one support element 18, a recess 19 is formed beneath the thin layer 17. The individual layers 13 required for the power detector are preferably applied to the upper side of the membrane 16 by means of thin-layer technology.

In order to realize an electrical connection between the high-frequency line 14 and the individual layers 13 of the power detector 9 and the individual layers 13 of the power detector 9 and the line 15 on an identical level, a recess 20 is provided in the substrate 2, the depth of which corresponds approximately to the height of the thin layer 17 with the addition of the height of the support element 18.

In the region of the recess 19 of the membrane 16, the recess 20 of the substrate 2 is filled with air, which provides a significantly lower thermal conductivity than the substrate 2 and accordingly prevents an escape of the heat from the power detector 9 via the air.

The recess 20 of the substrate 2 in the exemplary embodiment is additionally extended up to the nearest contact of the decoupling capacitor $6_{20}$. In this region, the recess 20 is filled with an adhesive compound 21 which carries the high-frequency line 13.

The high-frequency line 13 is preferably embodied in a conical manner, that is tapering, in the direction towards the power detector 9 in order to achieve a matching of the wave resistance of the line to the wave resistance of the power detector 9 and accordingly to achieve a correct power-level measurement of the high-frequency signal.

The invention is not restricted to the embodiments and variants presented. In particular, all combinations of all features claimed respectively in the individual claims, of all features disclosed respectively in the description and of all features illustrated in the individual figures of the drawings are also covered by the invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A calibration module with a substrate and at least one high-frequency terminal arranged on the substrate, which is connected with an allocated switching unit arranged on the substrate in a first switching configuration to at least one structure associated with an allocated calibration standard and by changing the first switching configuration to a second switching configuration to an allocated power detector,
    wherein the at least one structure associated with the calibration standard and the power detector are arranged on the substrate,
    wherein the power detector is arranged on a sub-region of the substrate,
    wherein an air-filled recess is provided in the sub-region of the substrate, and
    wherein the power detector is provided as an additional structure associated with a calibration standard.

2. The calibration module according to claim 1,
    wherein the power detector is configured to provide power calibration and system-error calibration.

3. The calibration module according to claim 1,
    wherein the power detector is only a single power detector and is integrated on the substrate.

4. The calibration module according to claim 1,
    wherein a decoupling capacitor is connected between the switching unit and the power detector.

5. The calibration module according to claim 1,
    wherein a recess is provided on the lower side of the substrate.

6. The calibration module according to claim 1,
    wherein the power detector is arranged on a membrane which is connected to the substrate via a connection technology.

7. The calibration module according to claim 6,
    wherein a recess is provided on the lower side of the membrane and
    wherein the membrane with the power detector is supported by at least one support element.

8. The calibration module according to claim 7,
    wherein the substrate provides an indentation for receiving the power detector supported on the support element and
    wherein the depth of the indentation is embodied in such a manner that the power detector can be connected on the same level to a high-frequency line applied to the substrate and connected to a decoupling capacitor.

9. The calibration module according to claim 8,
    wherein the indentation extends up to the decoupling capacitor in order to receive an adhesive compound.

10. The calibration module according to claim 8,
    wherein the indentation is filled with air in the region of the recess beneath the membrane.

11. The calibration module according to claim 8,
    wherein the power detector is connected to the decoupling capacitor via the high-frequency line extending in a tapering manner.

12. The calibration module according to claim 1,
    wherein an analog-digital converter arranged on the substrate for the analog-digital conversion of a power level generated by the power detector of a high-frequency signal supplied to the power detector is connected downstream of the power detector.

13. The calibration module according to claim 12,
    wherein the output of the analog-digital converter is connected to terminals of a data interface arranged on the substrate.

14. The calibration module according to claim 4, wherein a high-frequency line from the decoupling capacitor to the power detector has a conical shape in a direction towards the power detector to achieve an impedance matching.

* * * * *